(12) United States Patent
Chen

(10) Patent No.: US 6,232,180 B1
(45) Date of Patent: May 15, 2001

(54) SPLIT GATE FLASH MEMORY CELL

(75) Inventor: Chih Ming Chen, Hsinchu (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/347,203

(22) Filed: Jul. 2, 1999

(51) Int. Cl.[7] ................................................ H01L 21/336
(52) U.S. Cl. ................ 438/257; 438/259; 438/266; 438/589; 257/265; 257/322
(58) Field of Search ....................... 438/257, 266, 438/259, 589; 257/322, 265

(56) References Cited

U.S. PATENT DOCUMENTS

| | | | |
|---|---|---|---|
| 5,872,036 | * | 2/1999 | Sheu ........................... 438/266 |
| 5,970,341 | * | 10/1999 | Lin et al. ..................... 438/257 |
| 6,013,552 | * | 1/2000 | Oyama ......................... 438/264 |
| 6,093,608 | * | 7/2000 | Lin et al. ..................... 438/266 |

* cited by examiner

*Primary Examiner*—Richard Elms
*Assistant Examiner*—Pho Luu
(74) *Attorney, Agent, or Firm*—Blakely Sokoloff Taylor & Zafman LLP

(57) ABSTRACT

A split gate flash memory cell formed in a semiconductor substrate is disclosed. The memory cell comprises: a deep n-well formed in the substrate; a p-well formed in the deep n-well; a select gate structure formed on the p-well, the select gate structure comprising a stack of a gate oxide, a polysilicon layer, and a cap oxide; a tunnel oxide layer formed on the p-well, the tunnel oxide adjacent to the control gate structure; a floating gate formed over the select gate structure and extending over at least a portion of the tunnel oxide layer; a source formed in the p-well, the source formed adjacent to the floating gate; and a drain formed in the p-well, the drain formed adjacent to the select gate structure. The memory cell is programmed by source side channel hot electron and is erased using channel erasing to improve cycling endurance.

6 Claims, 3 Drawing Sheets

SPLIT GATE FLASH MEMORY CELL

FIELD OF THE INVENTION

This invention relates to semiconductor flash memory, and more particularly, to a split-gate flash memory.

BACKGROUND OF THE INVENTION

Toward the end of the 1980s, the semiconductor industry developed the electrically erasable PROM (EEPROM). The result was a new generation of memories targeted at the low cost, high density memory market. The term "flash" historically had been used to describe a mode of programming or erasing an entire memory array at one time. The flash memory is programmed by hot electron injection at the drain edge and erased by Fowler-Nordheim tunneling from the floating gate to the source.

Flash memory is classified as non-volatile memory because a memory cell in the flash memory can retain the data stored in the memory cell without periodic refreshing. Most prior art flash memory can store a single bit in a memory cell. In other words, the memory cell can either store a "one" or a "zero".

Many flash memory manufacturers chose a thin oxide floating gate process to make an electrically erasable PROM. As seen in FIG. 1, the basic cell consists of access transistors and a double polysilicon storage cell with a floating polysilicon gate (FG) isolated in silicon dioxide capacitively coupled to a second polysilicon control gate (CG) which is stacked above it. The storage transistor is programmed by Fowler-Nordheim tunneling of electrons through a thin oxide layer between the gate and the drain (D) of the transistor. The thin tunneling oxide generally is about 90 angstroms thick. One difficulty with this structure is that the memory cell may be erased to a negative threshold voltage and the channel between the drain and source will conduct leakage current even when the control gate (CG) is grounded. Furthermore, the prior art memory cell requires a programming current of 400 microamps to 1 milliamp per cell. In practical applications, this requires a very large charge pump to supply enough current.

Another prior art design known as the split gate flash cell is shown in FIG. 2. The split gate cell eliminates over erase sensitivity because even if the floating gate (FG) is over erased, conduction in the channel requires the biasing of the control gate which is over another portion of the channel between the source and drain. One disadvantage of this design is that the cell size is increased and the manufacture of the cell suffers from alignment sensitivity.

Yet another type of split gate cell utilizes the so-called source-side injection technique which minimizes the channel current during programming and an on-chip pump circuit can be used to provide adequate programming current by using a single power supply. However, there are still several drawbacks in this design. First, the misalignment from the poly1 (the floating gate) and poly2 (the control gate) layers will always make the cell current unsymmetric. In addition, this design results in easy punchthrough and the cell dimension is hard to scale down in size. Second, the erase mechanism will induce electron trapping and reduce endurance performance.

U.S. Pat. No. 5,614,746 to Hong et al., U.S. Pat. No. 5,674,767 to Lee et al., U.S. Pat. No. 5,789,296 to Sung et al., and the references cited therein illustrate these various prior art approaches to the split gate flash memory cell.

What is needed is a new design for a flash memory cell that overcomes the problems noted above.

SUMMARY OF THE INVENTION

A split gate flash memory cell formed in a semiconductor substrate is disclosed. The memory cell comprises: a deep n-well formed in said substrate; a p-well formed in said deep n-well; a select gate structure formed on said p-well, said select gate structure comprising a stack of a gate oxide, a polysilicon layer, and a cap oxide; a tunnel oxide layer formed on said p-well, said tunnel oxide adjacent to said control gate structure; a floating gate formed over said select gate structure and extending over at least a portion of said tunnel oxide layer; a source formed in said p-well, said source formed adjacent to said floating gate; and a drain formed in said p-well, said drain formed adjacent to said select gate structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
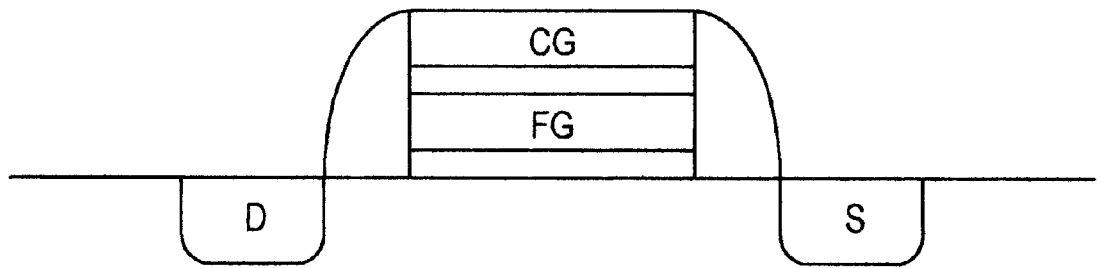
FIG. 1 is a schematic of a prior art stack gate flash memory cell.
Figure 2:
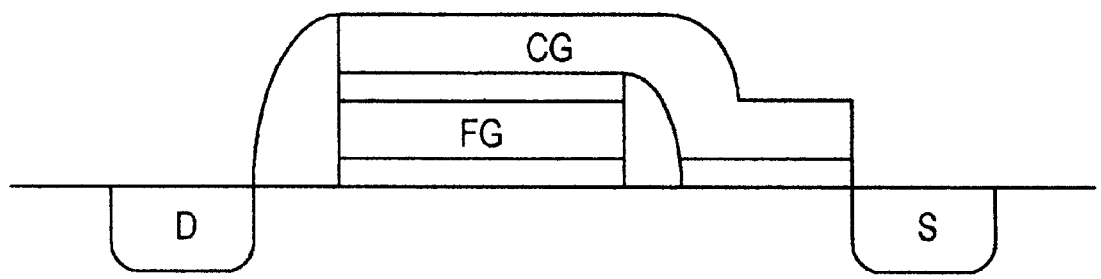
FIG. 2 is a schematic of a prior art split gate flash memory cell.
Figure 3:
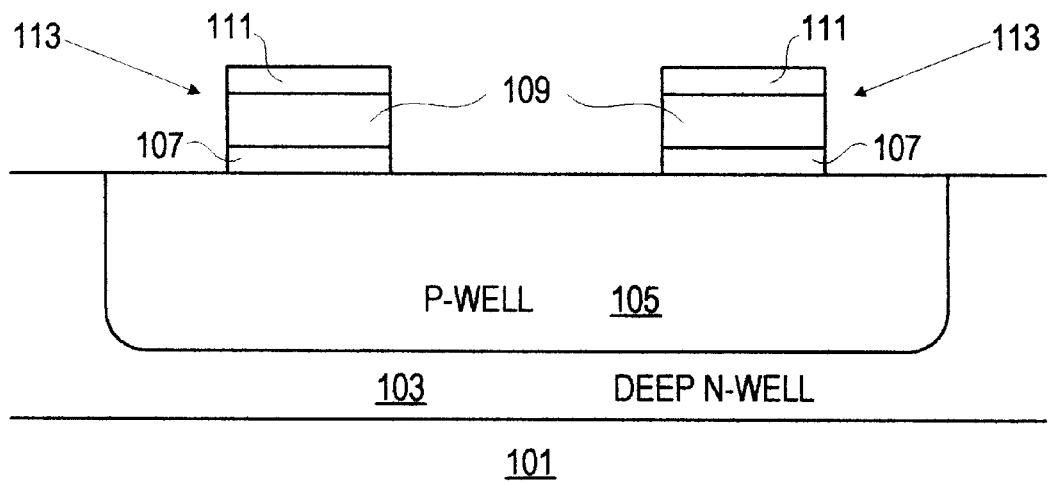
FIGS. 3–6 are cross-sectional views of a semiconductor substrate illustrating the steps in forming a flash memory cell in accordance with the present invention.

Turning to FIG. 3, a p-type silicon substrate 101 is provided. Formed with the substrate 101 is a deep n-well 103. Formed within the deep n-well 103 is a p-well 105. These structures can be formed using conventional ion implantation technologies.

Next, a gate oxide layer 107 is formed on the surface of the substrate 101. The gate oxide layer 107 is preferably on the order of 40–120 angstroms thick and can be formed using thermal oxidation or by chemical vapor deposition (CVD). Formed atop of the gate oxide layer 107 is a first polysilicon layer 109 having a preferred thickness of 1500–4000 angstroms. Next, a high temperature oxide layer 111 (referred to herein also as a "cap oxide") is formed atop of the first polysilicon layer 109 having a preferred thickness of 100 angstroms.

The gate oxide layer 107, the first polysilicon layer 109, and the high temperature oxide layer 111 is then patterned and etched to form select gate structures 113 shown in FIG. 3. The select gate structures 113 will eventually be connected to a word line and the select gate structures 113 will be the control gate of the flash memory cell.

Figure 4:
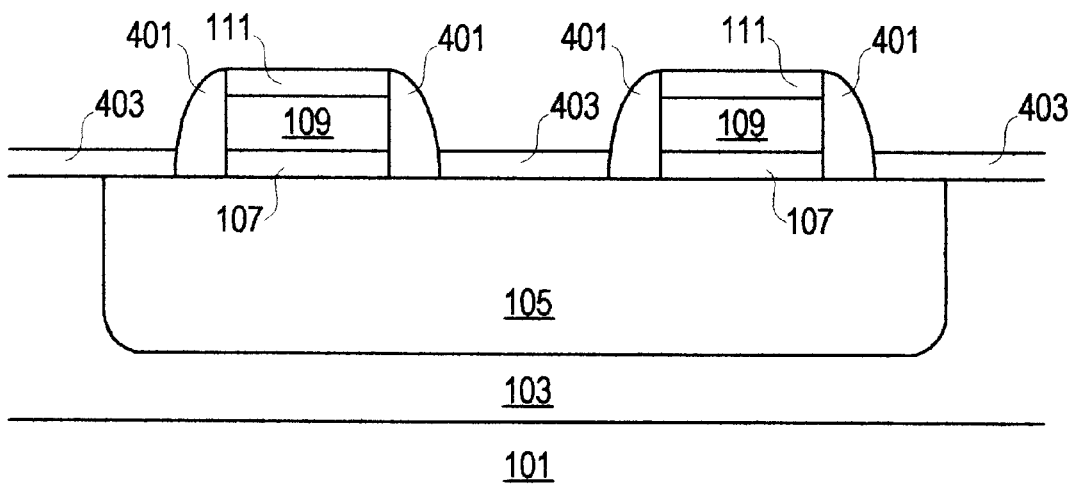

Next, turning to FIG. 4, sidewall spacers 401 are formed on the sidewalls of the select gate structures 113. The sidewall spacers 401 may be formed by depositing a high temperature oxide layer and then performing an etchback step as is conventional in the prior art for forming oxide spacers. After the spacers 401 are formed, a tunnel oxide 403 is formed on the exposed substrate 101 between the structures 113.

Figure 5:
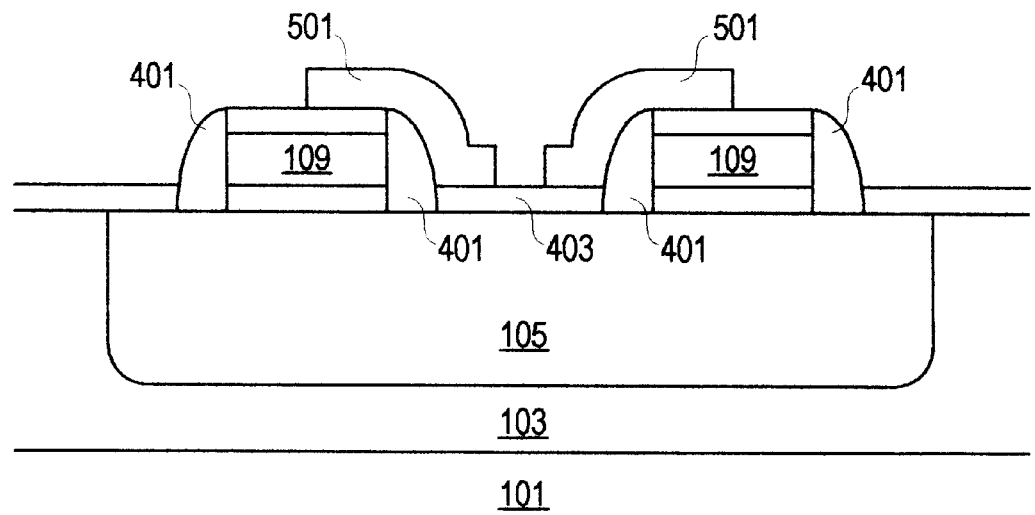

Next, turning to FIG. 5, a second polysilicon layer is deposited to a thickness of about 1500–4000 angstroms. The second polysilicon layer is then patterned and etched to form floating gates 501 in the split gate fashion. The floating gates 501 overlap at least a portion of the select gate structures 113 and extending past an edge of the select gate structures 113 onto the tunnel oxide 403.

Figure 6:
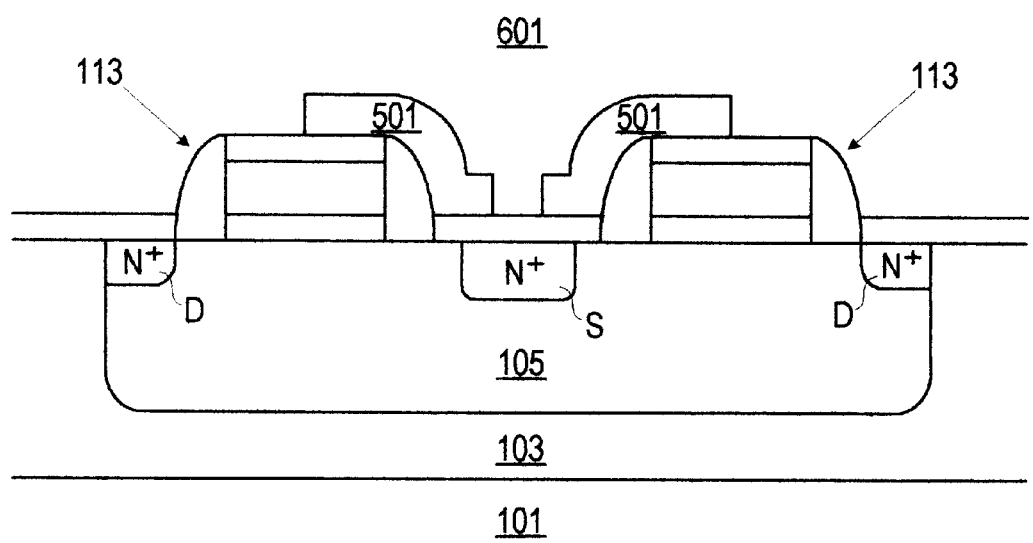

Finally, turning to FIG. 6, the drain and source regions are formed using ion implantation techniques. In particular, the source junction is formed first followed by a high temperature drive-in cycle to provide enough overlap with the floating gate 501 and so the source junction will be deeper than the drain junction. The source junction also serves as the control gate during programming. After the drive-in cycle, the drain junction is formed using conventional masking techniques. Note particularly that amongst two adjacent flash cells, a common source (S) is formed in between them. As a final step, an interlayer dielectric (ILD) 601 is formed over the floating gates to ensure that they are electrically isolated from any conductive structures.

The operation of the cell of FIG. 6 is as follows:

|  | Select gate | Drain | Source | p-well | Deep n-well |
| --- | --- | --- | --- | --- | --- |
| Program | 1.5–2.0 v | 0 v | 9–12 v | 0 v | 0 v |
| Erase | Floating | Floating | Floating | 10–15 v | 10–15 v |
| Read | $V_{cc}$ | 2 v | 0 v | 0 v | 0 v |

This cell utilizes the source side channel hot electron mechanism to program. During programming, the select gate is turned on and 9–12 volts is applied on the source. The voltage will couple to the floating gate to attract channel hot carriers to inject into the floating gate 501. This split gate cell uses source side injection and therefore the programming current will be around 100 nA-10 $\mu$A. This low current provides the capability of programming a large numbers of cells using an on-chip current pump.

The cell architecture utilizes the first polysilicon layer as the select gate and the second polysilicon layer as the floating gate. This provides a fixed channel length of the select gate defined by the feature size of the first polysilicon layer. Therefore, there is no punchthrough issue arising from photo misalignment between the two polysilicon layers and a variable select gate length relative to the prior art split gate flash technology.

The cell of the present invention will erase from the p-well and therefore triple well technology needs to be implemented. During erase, 10–15 volts is provided to the p-well and the deep n-well. The drain and source are left floating and the electrons on the floating gate will be pulled out from the second polysilicon layer through the 90 angstrom tunnel oxide by Fowler-Nordheim tunneling. This "channel erase" provides excellent endurance performance compared to the prior art.

During the read operation, $V_{cc}$ is applied to the select gate and about 2 volts on the drain. This cell provides symmetric cell current due to the use of the second polysilicon layer as the floating gate.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A split gate flash memory cell formed in a semiconductor substrate comprising:

a deep n-well formed in said substrate;

a p-well formed in said deep n-well;

a select gate structure formed on said p-well, said select gate structure comprising a stack of a gate oxide, a polysilicon layer, and a cap oxide;

a tunnel oxide layer formed on said p-well, said tunnel oxide adjacent to said select gate structure;

a floating gate formed over said select gate structure and extending over at least a portion of said tunnel oxide layer;

a source formed in said p-well, said source formed adjacent to said floating gate and acting as a control gate; and a drain formed in said p-well, said drain formed adjacent to said select gate structure.

2. The memory cell of claim 1 wherein said source is shared with a second split gate flash memory cell formed in accordance with claim 1.

3. The memory cell of claim 1 further including oxide sidewalls on said select gate structures.

4. The memory cell of claim 1 wherein said cell is erased by applying a positive voltage of 10–15 volts to said p-well and said n-well.

5. The memory cell of claim 1 wherein said cell is erased by applying a negative voltage to said select gate structure and a positive voltage to said p-well and said n-well.

6. The memory cell of claim 1 wherein said cell is programmed by applying a positive voltage of 9–12 volts to said source and a positive voltage of 1.5–2 volts to said select gate structure.

* * * * *